United States Patent
Deshmukh et al.

(10) Patent No.: US 7,485,548 B2
(45) Date of Patent: Feb. 3, 2009

(54) DIE LOSS ESTIMATION USING UNIVERSAL IN-LINE METRIC (UILM)

(75) Inventors: Purnima Deshmukh, Boise, ID (US); Steven J. Simmons, Fort Collins, CO (US)

(73) Assignee: Micron Technology, Inc., Boise, ID (US)

( * ) Notice: Subject to any disclaimer, the term of this patent is extended or adjusted under 35 U.S.C. 154(b) by 503 days.

(21) Appl. No.: 11/276,719

(22) Filed: Mar. 10, 2006

(65) Prior Publication Data

US 2007/0212798 A1    Sep. 13, 2007

(51) Int. Cl.
*H01L 29/417* (2006.01)
*H01L 29/36* (2006.01)
*H01L 31/00* (2006.01)
*H01L 31/06* (2006.01)

(52) U.S. Cl. .......................... 438/460; 438/33; 438/68; 438/110; 438/113; 438/114; 438/458; 438/461; 438/462; 438/463; 458/464; 458/465; 458/FOR. 386

(58) Field of Classification Search .................. 438/33, 438/68, 110, 113, 114, 458, 460, 461, 462, 438/463, 464, 465, FOR. 386
See application file for complete search history.

(56) References Cited

U.S. PATENT DOCUMENTS

| | | | |
|---|---|---|---|
| 5,777,901 A | 7/1998 | Berezin et al. | |
| 6,265,232 B1 | 7/2001 | Simmons | |
| 6,496,958 B1 | 12/2002 | Ott et al. | |
| 6,610,550 B1 | 8/2003 | Pasadyn et al. | |
| 6,613,590 B2 | 9/2003 | Simmons | |
| 6,751,519 B1 | 6/2004 | Satya et al. | |
| 6,890,775 B2 | 5/2005 | Simmons | |
| 2005/0158887 A1 | 7/2005 | Simmons | |

OTHER PUBLICATIONS

Kasten, A., et al., "Calculating defect limited yields from in-line inspections", *Semiconductor International*, 20(8), (Jul. 1997),202-4, 206, 208.

Mullenix, P., et al., "Limited yield estimation for visual defect sources", *IEEE Transactions on Semiconductor Manufacturing*, 10(1), (Feb., 1997),17-23.

Stapper, C. H., et al., "Integrated circuit yield statistics", *Proceedings of the IEEE*, 71(4), (Apr., 1983),453-470.

*Primary Examiner*—Thanh V Pham
(74) *Attorney, Agent, or Firm*—Schwegman, Lundberg & Woessner, P.A.

(57) ABSTRACT

A system predicts die loss for a semiconductor wafer by using a method referred to as universal in-line metric (UILM). A wafer inspection tool detects defects on the wafer and identifies the defects by various defect types. The UILM method applies to various ways of classification of the defect types and takes into account the impact of each defect type on the die loss.

20 Claims, 5 Drawing Sheets

| PART | LEVEL | ESTIMATED BASELINE YIELD | INSPECTION TOOL | DEFECT ATTRIBUTE | KILL RATIO | | | |
|---|---|---|---|---|---|---|---|---|
| Y85B | 71 ACI INSPECTION | 0.78 | KLA | ADC (FB) | FB14 | FB1 | FB26 | FB12 |
|  |  |  |  |  | 0.23 | 0.54 | 1 | 0.005 |
| Y85B | POLY PLUG INSPECTION | 0.78 | AIT | DEFECT | DEFECT |  |  |  |
|  |  |  |  |  | 0.34 |  |  |  |
| Y85B | 50 ACI INSPECTION | 0.78 | KLA | SIZE BIN (SB) | SB1 (0–0.3) | SB2 (0.3–1) | SB3 (1–2) | SB4 (>2) |
|  |  |  |  |  | 0.001 | 0.32 | 0.4 | 0.95 |
| W33A | 59 ACI INSPECTION | 0.85 | KLA | RTC (RB) | RB1 | RB2 | RB3 |  |
|  |  |  |  |  | 0.34 | 1 | 0 |  |

Fig. 5

US 7,485,548 B2

DIE LOSS ESTIMATION USING UNIVERSAL IN-LINE METRIC (UILM)

TECHNICAL FIELD

This document relates generally to semiconductor integrated circuit (IC) manufacturing and particularly, but not by way of limitation, to die loss estimation at various levels of wafer inspection during a process of semiconductor IC manufacturing.

BACKGROUND

Semiconductor ICs are formed on a semiconductor wafer that is divided into a plurality of dice each being an IC device. The wafer is tested at different stages of manufacturing for defects to ensure the quality and yield of the ICs. The defects may be inherent in the semiconductor material of the wafer or may result from any step of the manufacturing. Depending on the type and location, a defect may cause an IC to fail, require some repair work of the IC, or be harmless. In some examples, the potential impact of a defect on the die loss depends at least partially on the potential use (or grade) of the IC. Some defects can be tolerated because of functional redundancy provided by design. Some defects can be corrected during the manufacturing process once they are detected.

Inspection and die loss prediction at various stages of IC manufacturing substantially reduces the cost of ICs. The cost of an IC includes the cost of testing at different stages as well as the cost to perform each step of manufacturing. Detection of failing dice potentially saves the cost for performing further manufacturing and test on parts that are known to fail. In addition, the detection of the defects and identification of the type of defect allows for a decision on whether the manufacturing process of a wafer or other wafers in the lot should be continued, terminated, or adjusted (for example, to allow repair of defects) following each step of wafer inspection. To make such a decision, the die yield is to be predicted after each step of wafer inspection. Wafer inspection tools that detect defects on wafers and identify the detected defects by various defect types are commercially available. What is needed is an analysis system that predicts the die loss for a wafer based on defects detected by a wafer inspection tool during each step of wafer inspection.

SUMMARY

A system predicts die loss for a semiconductor wafer by using a method referred to as universal in-line metric (UILM). A wafer inspection tool detects defects on the wafer and identifies the defects by various defect types. The UILM method applies to various ways of classification of the defect types and takes into account the impact of each defect type on the die loss.

In one embodiment, a method for in-line prediction of die loss for a semiconductor wafer is provided. Defects are detected on the wafer. Such defects are each identified by a defect type i of a plurality of defect types. In-line defect data are produced. The in-line defect data include a defective die quantity and defect quantities. The defective die quantity represents the number of defective dice on the wafer. The defect quantities are each a number $n_i$ of detected defects identified by the defect type i on each of the defective dice. The defective dice are each a die having at least one detected defect. A plurality of kill ratios is received. The kill ratios are each a kill ratio $\lambda_i$ produced for the defect type i of the plurality of defect types using off-line historical defect data resulting from inspection of previously fabricated semiconductor wafers. An estimated die loss (EDL) is produced for the wafer as a function of the plurality of kill ratios, an estimated yield of baseline dice, the defective die quantity, and the defect quantities. The baseline dice are each a die having none of the detected defects.

In one embodiment, a system provides for in-line prediction of die loss for a semiconductor wafer during a manufacturing process. The system includes an off-line history database, a wafer inspection tool, an in-line inspection database, and an in-line die loss estimator. The off-line history database contains one or more kill ratios associated with one or more defect types. Each of the one or more kill ratios is a kill ratio $\lambda_i$ produced for a defect type i of the one or more defect types and is representative of a probability of a die failure due to the defect type i. The wafer inspection tool detects defects each identified by a defect type of a plurality of defect types on the wafer and produces in-line defect data associated with the detected defects. The plurality of defect types includes the one or more defect types with which the one or more kill ratios are associated. The defect data include a defective die quantity and defect quantities. The defective die quantity represents the number of defective dice each being a die having at least one of the detected defects. The defect quantities are each a defect quantity $n_i$ representative of a number of detected defects identified by the defect type i on each of the defective dice. The in-line inspection database stores the in-line defect data. The in-line die loss estimator receives the one or more kill ratios and the in-line defect data, the in-line die loss estimator configured to produce an EDL using the one or more kill ratios and the in-line defect data.

This Summary is an overview of some of the teachings of the present application and is not intended to be an exclusive or exhaustive treatment of the present subject matter. Further details about the present subject matter are found in the detailed description and appended claims. Other aspects of the invention will be apparent to persons skilled in the art upon reading and understanding the following detailed description and viewing the drawings that form a part thereof. The scope of the present invention is defined by the appended claims and their legal equivalents.

BRIEF DESCRIPTION OF THE DRAWINGS

The drawings illustrate generally, by way of example, but not by way of limitation, various embodiments discussed in the present document.

FIG. 5 is an illustration of an example of a model lookup table used by the system of FIG. 1.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

This document discusses a system and method for estimating die loss for a wafer that takes into account the impact of each of one or more specified type defects on the yield of each die on the wafer. The method is referred to as universal in-line metric (UILM) as it applies to various ways of classifying the defect types. According to the UILM method, kill ratios each being specific to a defect type are generated using off-line historical data from inspection of previously fabricated wafers. These kill ratios are then applied to produce an estimated die loss (EDL) for a wafer that is currently being fabricated and inspected, using in-line data resulted from inspection at various levels.

Figure 1:
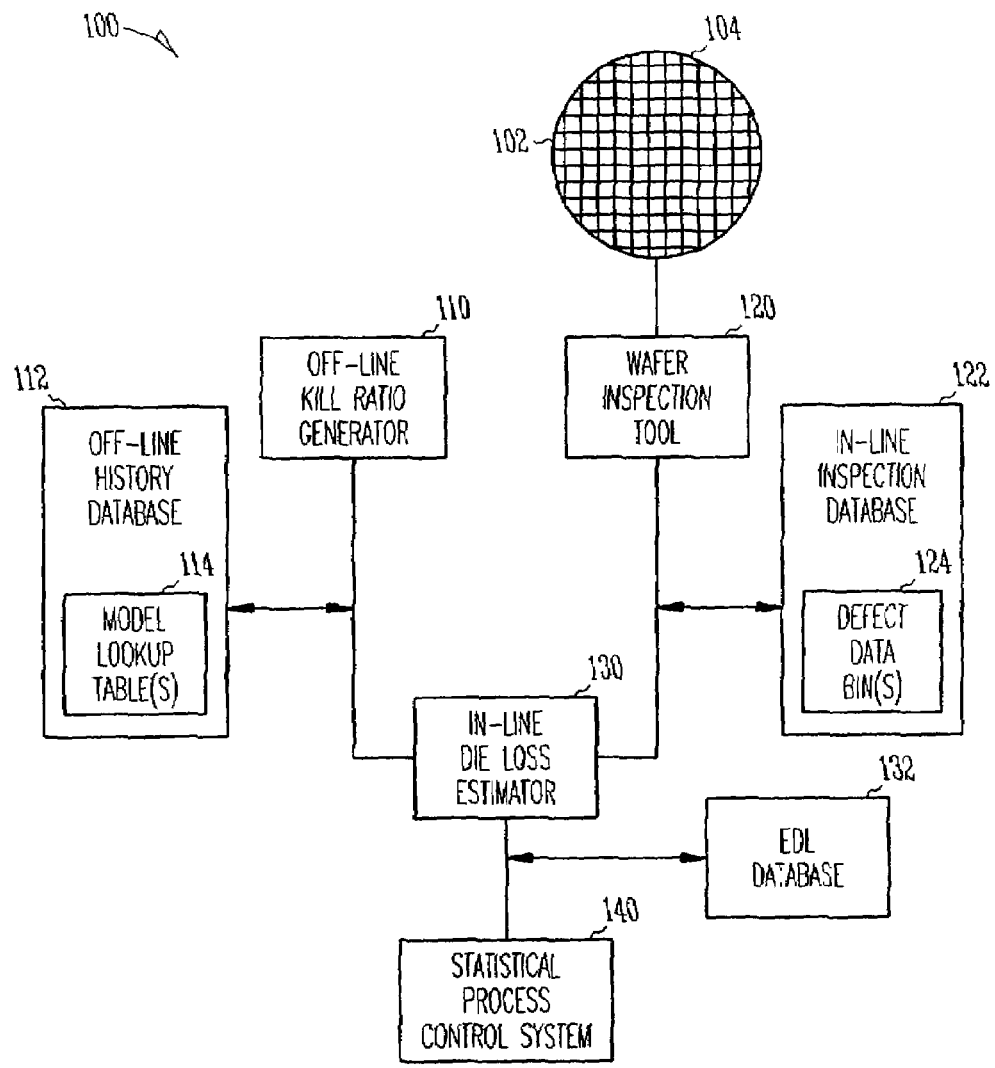
FIG. 1 is a block diagram illustrating an embodiment of a system for predicting die loss for a semiconductor wafer.

FIG. 1 is a block diagram illustrating an embodiment of a system 100 for predicting die loss for a semiconductor wafer 102 including a plurality of dice 104. System 100 includes an off-line kill ratio generator 110, an off-line history database 112, a wafer inspection tool 120, an in-line inspection database 122, an in-line die loss estimator 130, an EDL database 132, and a statistical process control system 140.

Off-line kill ratio generator 110 produces one or more kill ratios for one or more defect types specified for detection during an inspection performed by wafer inspection tool 120. Each kill ratio $\lambda_i$ is produced for a defect type i and represents the probability of a die failure due to the defect type i. Off-line kill ratio generator 110 produces each kill ratio N using off-line historical data produced using previously fabricated and inspected wafers. The off-line data include a historical probability of yield $\eta_{yield}$ for a single die, an estimated yield of baseline dice $Y_{bl}$, and a historical defect quantity $n_i$ being a number of defects identified for the defect type i on that single die. The probability of yield is also referred to as yield. The baseline dice are dice with no detected defects. In one embodiment, off-line kill ratio generator 110 produces each kill ratio N by solving Equation (1):

$$\eta_{Yield} = (Y_{bl}) \cdot \prod_i (1 - \lambda_i)^{n_i}. \quad (1)$$

The production of the kill ratio $\lambda_i$ using Equation (1) is further discussed below with a specific example.

Off-line history database 112 stores off-line wafer information including the off-line historical data produced using the previously fabricated and inspected wafers and information derived from the off-line historical data, including the one or more kill ratios produced by off-line kill ratio generator 110. In one embodiment, as illustrated in FIG. 1, off-line history database 112 includes one or more model lookup tables 114 each including off-line wafer information representative of a part model code, an inspection level code, the defect attribute indicating how the defect types are classified, an indication of whether sampled (instead of actual) data are used to project one or more kill ratios, an estimated yield of baseline dice ($Y_{bl}$), a kill ratio for defects of unknown defect type ($\lambda_u$, for all detected defects that do not belong to any defect type for which a kill ratio is specifically computed or projected), and the one or more kill ratios for the selected one or more defect types. An example of such a model lookup table is illustrated in Table 1.

TABLE 1

Example of a model lookup table.

| | |
|---|---|
| Part | (wafer/die part number or code) |
| Level | (level/step of wafer inspection) |
| Defect Attribute | (how defects are classified) |
| Sample Data | (sampled or actual defect data) |
| Yield of baseline dice, $Y_{bl}$ | (user defined estimated yield of baseline dice) |
| Unknown Type kill ratio, $\lambda_u$ | ($\lambda$ for all defects not of types 1 to k) |
| Type 1 kill ratio, $\lambda_1$ | ($\lambda$ for defects of types 1) |
| Type 2 kill ratio, $\lambda_2$ | ($\lambda$ for defects of types 2) |
| Type 3 kill ratio, $\lambda_3$ | ($\lambda$ for defects of types 3) |
| ... | ... |
| Type k kill ratio, $\lambda_k$ | ($\lambda$ for defects of types k) |

Wafer inspection tool 120 detects defects each identified by a defect type of a plurality of defect types on wafer 102. The plurality of defect types includes the one or more defect types for which the one or more kill ratios are produced by off-line kill ratio generator 110 and contained in off-line historical database 112. Based on the results of the inspection, wafer inspection tool 120 produces defect data associated with the detected defects. The defect data include a defective die quantity m and defect quantities. The defective die quantity m represents the number of defective dice each being a die having at least one of the detected defects. The defect quantities are each a defect quantity $n_i$ representative of a number of detected defects identified by the defect type i on each of the defective dice. Examples of wafer inspection tool 120 includes commercially available inspection tools such as KLA (KLA Tencor, San Jose, Calif.), AIT (KLA Tencor, San Jose, Calif.), ORBOT (Applied Materials, Santa Clara, Calif.), and SURFSCAN (KLA Tencor, San Jose, Calif.).

In-line inspection database 122 contains the defect data. In one embodiment, as illustrated in FIG. 1, in-line inspection database 122 includes one or more defect data bins 124. Defect data bin(s) 124 each contain data representative of the defect quantity $n_i$ identified for the defect type i in each die of the plurality of dice. Table 2 illustrates an example of the defect data in a defect data bin (each blank cell is to be filled with the number of defects detected).

TABLE 2

Example of defect data in a defect data bin (each blank cell is to be filled with the number of defects detected).

| Die Number | Total Defects | Type 1 defects, $n_1$ | Type 2 defects, $n_2$ | Type 3 defects, $n_3$ | ... | Type k defects, $n_k$ |
|---|---|---|---|---|---|---|
| # 1 | | | | | | |
| # 2 | | | | | | |
| # 3 | | | | | | |
| ... | | | | | | |
| # m | | | | | | |

Figure 2:
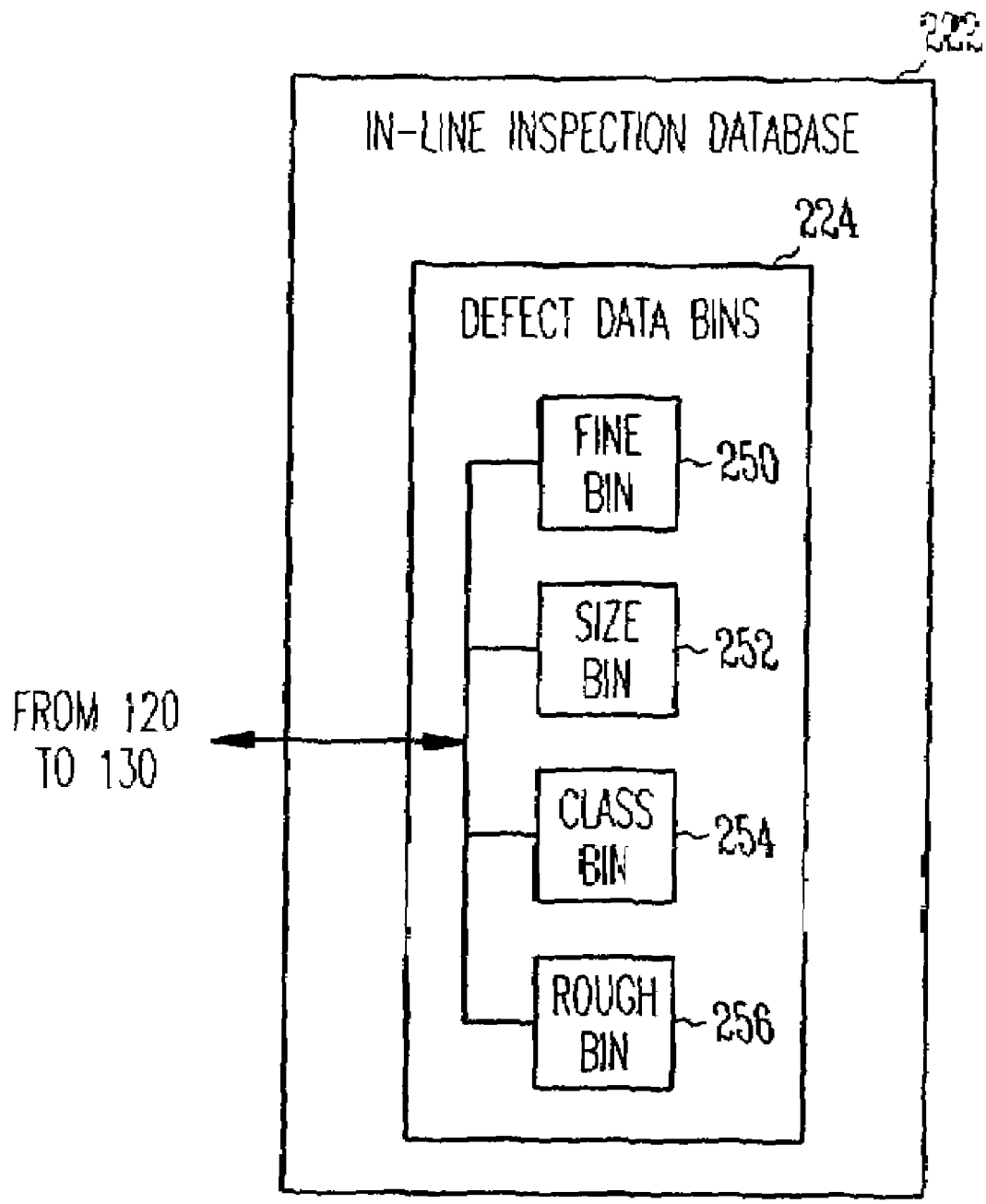
FIG. 2 is a block diagram illustrating an embodiment of an in-line inspection database of the system of FIG. 1.

FIG. 2 is a block diagram illustrating an embodiment of in-line inspection database 222, which is a specific embodiment of in-line inspection database 122. In-line inspection database 222 includes defect data bins 224, which is a specific embodiment of defect data bin(s) 124. As illustrated in FIG. 2, defect data bins 224 include a fine bin 250, a size bin 252, a class bin 254, and a rough bin 256. Fine bin 250 contains defect data grouped by predefined defect types. Size bin 252 contains defect data grouped by defect sizes at predetermined size intervals. Class bin 254 contains defect data grouped by defect classification, such as manual classification or automatic scanning electron microscopic (SEM) classification. Rough bin 256 contains defect data grouped by real-time classification of every defect.

In-line die loss estimator 130 produces an estimated die loss (EDL) using the one or more kill ratios from off-line history database 112 and the defect data from in-line inspection database 122. In one embodiment, in-line die loss estimator 130 produces an estimated probability of yield $\eta_{yield}$ for each die on the wafer using Equation (1) with the estimated yield of baseline dice $Y_{bl}$ and the one or more kill ratios from off-line history database 112 and the defect quantity $n_i$ from in-line inspection database 122. Then, in-line die loss estimator 130 computes the EDL for the wafer using Equation (2):

$$EDL = \left( Y_{bl} \cdot m - Y_{bl} \cdot \sum_{j=1}^{m} \eta_{Yield} \right). \quad (2)$$

That is, the EDL is the difference between (i) the expected number of yielding defective dice if there were no detected defect present at the inspection level and (ii) the predicted number of yielding defective dice. Using the $\eta_{yield}$ as given by Equation (1), Equation (2) is expressed as Equation (3):

$$EDL = (Y_{bl}) \cdot \left( m - \sum_{j=1}^{m} \prod_{i} (1 - \lambda_i)^{n_i} \right). \quad (3)$$

In one embodiment, in-line die loss estimator 130 computes the EDL using Equation (3), with the estimated yield of baseline dice $Y_{bl}$ and the one or more kill ratios from off-line history database 112 and the defect quantity $n_i$ from in-line inspection database 122.

EDL database 132 stores each EDL produced by in-line die loss estimator 130, which allows for prediction of die loss by computing an EDL in real time, following each inspection level (step) during a wafer inspection process. Statistical process control system 140 receives the EDLs contained in EDL database 132 to generate reports and trend charts indicating how the defects affect the die yield or loss.

In various embodiments, system 100 is a computer based system. Off-line kill ratio generator 110, off-line history database 112, wafer inspection tool 120, in-line inspection database 122, in-line die loss estimator 130, EDL database 132, and statistical process control system 140, or portions thereof, are parts of a system including one or more processors or computers. Off-line kill ratio generator 110, wafer inspection tool 120, in-line die loss estimator 130, and statistical process control system 140, or portions thereof, are each implemented as software, hardware, or a combination of software and hardware.

Figure 3:
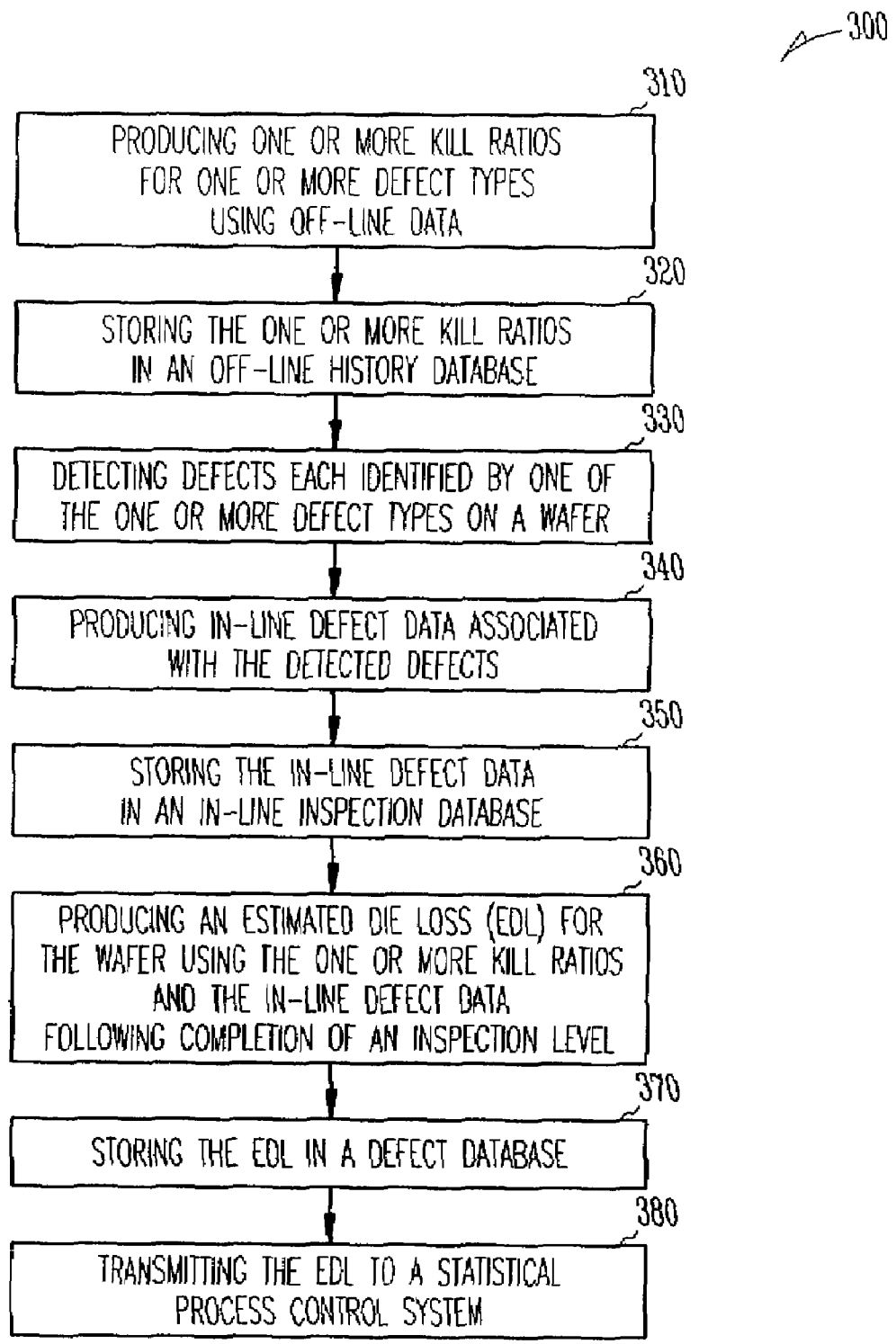
FIG. 3 is a flow chart illustrating an embodiment of a method for predicting die loss for a semiconductor wafer.

FIG. 3 is a flow chart illustrating an embodiment of a method 300 for predicting die loss for a semiconductor wafer using UILM. In one embodiment, method 300 is performed using system 100. In one embodiment, system 100 is a computer-based system including a computer-readable medium having computer-executable instructions for performing method 100 or portions thereof.

One or more kill ratios for one or more defect types are produced using off-line data at 310. The one or more defect types are specified for detection during an in-line inspection. In various embodiments, the one or more defect types are specified by automatic classification (such as by an inspection tool), by manual classification, by ranges of defect size, by automatic scanning electron microscopic classification, by predefined classification, and/or by real-time classification. The one or more kill ratios are produced using off-line data resulted from inspection of previously fabricated semiconductor wafers. Each kill ratio $\lambda_i$ is produced for a defect type i and is representative of the probability of a die failure due to the defect type i. In one embodiment, the kill ratio $\lambda_i$ is produced for the defect type i using the off-line data including a historical probability of yield $\eta_{yield}$ for a single die, an estimated yield of baseline dice $Y_{bl}$, and a historical defect quantity $n_i$ representative of a number of defects identified for the defect type i in the single die. In a specific embodiment, the kill ratio $\lambda_i$ is produced by solving Equation (1).

The one or more kill ratios are stored in an off-line history database at 320. In one embodiment, model lookup tables are stored. The model lookup tables each include off-line data representative of a part model code, an inspection level code, the defect attribute indicating how the defect types are classified, an indication of whether sampled (instead of actual) data are used to project one of more kill ratios, an estimated yield of baseline dice ($Y_{bl}$), a kill ratio for defects of unknown defect type ($\lambda_u$, for all detected defects that do not belong to any defect type for which a kill ratio is specifically computed or projected), and the one or more kill ratios for the selected one or more defect types. Table 1 illustrates an example of a model lookup table.

Defects each identified by one of the one or more defect types are detected on a wafer at 330. As a result, in-line defect data associated with the detected defects are produced at 340. The in-line defect data include a defective die quantity m and defect quantities. The defective die quantity m represents the number of defective dice each being a die having at least one of the detected defects. The defect quantities are each a defect quantity $n_i$ representative of a number of detected defects identified by the defect type i on each of the defective dice. The in-line defect data are stored in an in-line inspection database at 350. In one embodiment, the defect data are contained in one or more defect data bins each containing data representative of the defect quantity $n_i$ identified for the defect type i in each die of the plurality of dice. Examples of the defect data bins are illustrated in FIG. 2.

An EDL is produced for the wafer using the one or more kill ratios from the off-line history database and the in-line defect data from the in-line inspection database following completion of an inspection level at 360. In one embodiment, a probability of yield $\eta_{yield}$ for each die on the wafer is estimated using Equation (1) with the estimated yield of baseline dice $Y_{bl}$ and the one or more kill ratios from the off-line history database and the defect quantity $n_i$ from the in-line inspection database. Then, the estimated die loss EDL for the wafer is computed using Equation (2). In another embodiment, the EDL is produced using Equation (3).

The EDL is stored in an EDL database at 370. The EDL is transmitted to a statistical process control system at 380, allowing generation of reports or trend charts.

Method 100 is further discussed, with further explanation and specific examples, as follows:

Off-Line Generation of Kill Ratios

Kill ratio ($\lambda$) and estimated die loss (EDL) are analyzed for wafers that have both probe bin data (off-line historical defect data recorded from inspection of previously fabricated wafers) and in-line defect bin data (data resulted from in-line inspection of wafers that are currently being fabricated). The analysis quantifies the impact of detected defects on yield at the die level and the defect level.

On the die level, a kill ratio is computed for an in-line defective die (die with at least one detected defect). The kill ratio represents the probability that a die will fail given that it has at least one defect. It is computed using off-line historical defect data for inspected dice with Equation (4):

$$\lambda = 1 - \frac{Y_{dd}}{Y_{bl}} = 1 - \frac{\frac{TY_{dd}}{T_{dd}}}{\frac{TY_{bl}}{T_{bl}}}, \quad (4)$$

where $Y_{dd}$ is the yield of defective dice (yield of dice each having at least one detected defect), $Y_{bl}$ is the yield of baseline dice (yield of dice each having no detected defect), $TY_{dd}$ is the number of good defective dice (number of yielding dice each having at least one detected defect), $T_{dd}$ is the number of defective dice (number of dice each having at least one detected defect), $TY_{bl}$ is the total good baseline die (number of yielding dice each having no detected defect), and $T_{bl}$ is total baseline die (number of dice each having no detected defect). Thus, the kill ratio indicates a ratio of the yield of defective dice to the yield of non-defective dice and quantifies the risk of die loss associated with the defects at a given level. A kill ratio has a value between 0 and 1 (i.e., 0≦kill ratio≦1). The larger the value of the kill ratio, the more likely a die will fail. A kill ratio value of 1 indicates that the defects always kill a die. If the yield of the defective dice is greater than the yield of the baseline dice, a negative value for the kill ratio results. In this case, the kill ratio is set to 0, indicating that the defects have no impact on yield of a die. Defects are not allowed to have a positive effect on the yield of a die.

While the kill ratio indicates how defects affect a die, the EDL indicates how defects affect a wafer. At the die level, the EDL is a measurement in die units that takes into account both the kill ratio and the number of dice affected. The EDL is calculated using Equation (5):

$$EDL = Y_{bl} \cdot T_{dd} - TY_{dd}. \quad (5)$$

That is, the EDL is the difference between the number of yielding dice expected for the defective die if there is no defect present on the wafer and the actual number of yielding defective dice. The EDL has a value of zero or greater.

Table 3 is an example of off-line information resulting from a wafer inspection that provides for calculation of the EDL. The yield is 275/380=0.72368. The yield of baseline dice $Y_{bl}$ is 224/291=0.76976. The yield of defective dice $Y_{dd}$ is 51/89=0.57303. The kill ratio is 1−0.57303/0.76976=0.25557. The EDL is 0.76976×89−51=17.51. This calculation can be repeated for a plurality of wafers to generate a die loss trend for each inspection step.

TABLE 3

An example of off-line data resulted from wafer inspection.

| | |
|---|---|
| Number of defects detected | 143 |
| Number of dice inspected | 380 |
| Number of baseline (non-defective) dies ($T_{bl}$) | 291 |
| Number of defective dice ($T_{dd}$) | 89 |
| Number of yielding dice | 275 |
| Number of yielding defective dice ($TY_{dd}$) | 51 |
| Number of yielding baseline dice ($TY_{bl}$) | 224 |

The die level analysis does not take into account the specific types of defects detected. To analyze die loss due to each specific defect type, as discussed above, Equation (1) is used to produce a kill ratio for each defect type using off-line historical defect data, and Equation (2) is used to produce an EDL that takes into account the specific types of defects. The kill ratio is produced by solving Equation (1) with the off-line historical defect data. In one embodiment, the off-line historical defect data are broken into subsets by the defect type. For each defect type, dice that have exclusively defects of that defect type are used along with the baseline dice to compute an initial guess for the kill ratio. Next, the Microsoft® Excel Solver function is called, which simultaneously solves all the equations to result a kill ratio per single defect for each of the defect types. Then, the EDL attributed to each of the defect types can be computed.

The steps for using the Excel Solver function include (i) making a yield prediction for each defective die using Equation (1) with the initial kill ratios; (ii) taking the sum of the yield probabilities for each die; (iii) counting the actual number of yielding defective dice; and (iv) taking the difference of these two values and using the Excel Solver function with the goal of making this difference equal to zero.

For example, a kill ratio $\lambda_{FB1}$ is to be produced for a defect type FB1 of a plurality of defect types. The yield of baseline dice is 0.76976. The number of defective dice each having at least one defect of defect type FB1 is 30. The number of yielding defective dice is 18. The yield of defective dice is 18/30=0.6. The initial kill ratio for defect type FB1 is:

$$\lambda_{FB1} = 1 - \left(\frac{0.6}{0.76976}\right) = 0.22054.$$

The next step is to determine the kill ratio for the dice having only defects of defect type FB1. This eliminates the effect of other defect types from the data. The number of detected dice each having at least one defect of only defect type FB1 is 25. The number of yielding defective dice is 17. The yield of defective dice is 17/25=0.68. The resulting kill ratio for defect type FB1 is:

$$\lambda_{FB1} = 1 - \left(\frac{0.68}{0.76976}\right) = 0.11661$$

Then, the effect of multiple defects of defect type 1 is quantified by solving Equation (1) for those dice with only defects of defect type 1. In this case, there are 27 defects of defect type 1 on 25 dice. The computed kill ratio $\lambda_{FB1}$ per single defect of defect type 1 is 0.10891. The final step is to use the Excel Solver to produce the kill ratio for every defect type and every die. The previously computed kill ratio is used as the initial guess for the Solver function. The final result for the kill ratio $\lambda_{FB1}$ is determined to be 0.16420.

Table 4 presents an example with 6 dice from a wafer.

TABLE 4

An example of wafer inspection results for six dice.

| | | Solver kill ratio | | | | Yield of |
|---|---|---|---|---|---|---|
| | | 0.10793 | 0.1642 | 0.20946 | 1 | baseline |
| | | Type | Type | Type | Type | dice = 0.76976 |
| | Probe | FB12 | FB1 | FB0 | FB26 | Predicted |
| Die # | Bin | Defects | Defects | Defects | Defects | Yield |
| 1 | 7 | 1 | 2 | 0 | 0 | 0.47969 |
| 2 | * | 0 | 2 | 0 | 0 | 0.53772 |
| 3 | 6 | 0 | 0 | 1 | 1 | 0 |
| 4 | * | 2 | 0 | 0 | 0 | 0.61257 |

TABLE 4-continued

An example of wafer inspection results for six dice.

| Die # | Probe Bin | Solver kill ratio | | | | Yield of baseline dice = 0.76976 Predicted Yield |
|---|---|---|---|---|---|---|
| | | 0.10793 Type FB12 Defects | 0.1642 Type FB1 Defects | 0.20946 Type FB0 Defects | 1 Type FB26 Defects | |
| 5 | 7 | 2 | 0 | 2 | 0 | 0.38283 |
| 6 | * | 1 | 0 | 0 | 0 | 0.68668 |

The predicted number of yielding defective dice is computed as follows:

$\eta_{Yield}=(0.76976)\cdot(1-0.10793)^1\cdot(1-0.1642)^2=0.47969$ Die #1

$\eta_{Yield}=(0.76976)\cdot(1-0.1642)^2=0.53772$ Die #2

$\eta_{Yield}=(0.76976)\cdot(1-0.20946)^1\cdot(1-1)^1=0$ Die #3

$\eta_{Yield}=(0.76976)\cdot(1-0.10793)^2=0.61257$ Die #4

$\eta_{Yield}=(0.76976)\cdot(1-0.10793)^2\cdot(1-0.20946)^2=0.38283$ Die #5

$\eta_{Yield}=(0.76976)\cdot(1-0.10793)^1=0.68668$ Die #6

The predicted number of yielding dice is 2.7, i.e., the sum of the individual probabilities of yield for dice #1-6 as computed above. The EDL is computed for each defect type by stripping off the defect of interest, re-computing the predicted yield, and taking the difference. For example, the EDL for defect type FB1 is computed as follows:

$\eta_{Yield}=(0.76976)\cdot(1-0.10793)^1\cdot(1-0.1642)^0=0.68668$ Die #1

$\eta_{Yield}=(0.76976)\cdot(1-0.1642)^0=0.76976$ Die #2

$\eta_{Yield}=(0.76976)\cdot(1-0.20946)^1\cdot(1-1)^1=0$ Die #3

$\eta_{Yield}=(0.76976)\cdot(1-0.10793)^2=0.61257$ Die #4

$\eta_{Yield}=(0.76976)\cdot(1-0.10793)^2\cdot(1-0.20946)^2=0.38283$ Die #5

$\eta_{Yield}=(0.76976)\cdot(1-0.10793)^1=0.68668$ Die #6

Figure 4:
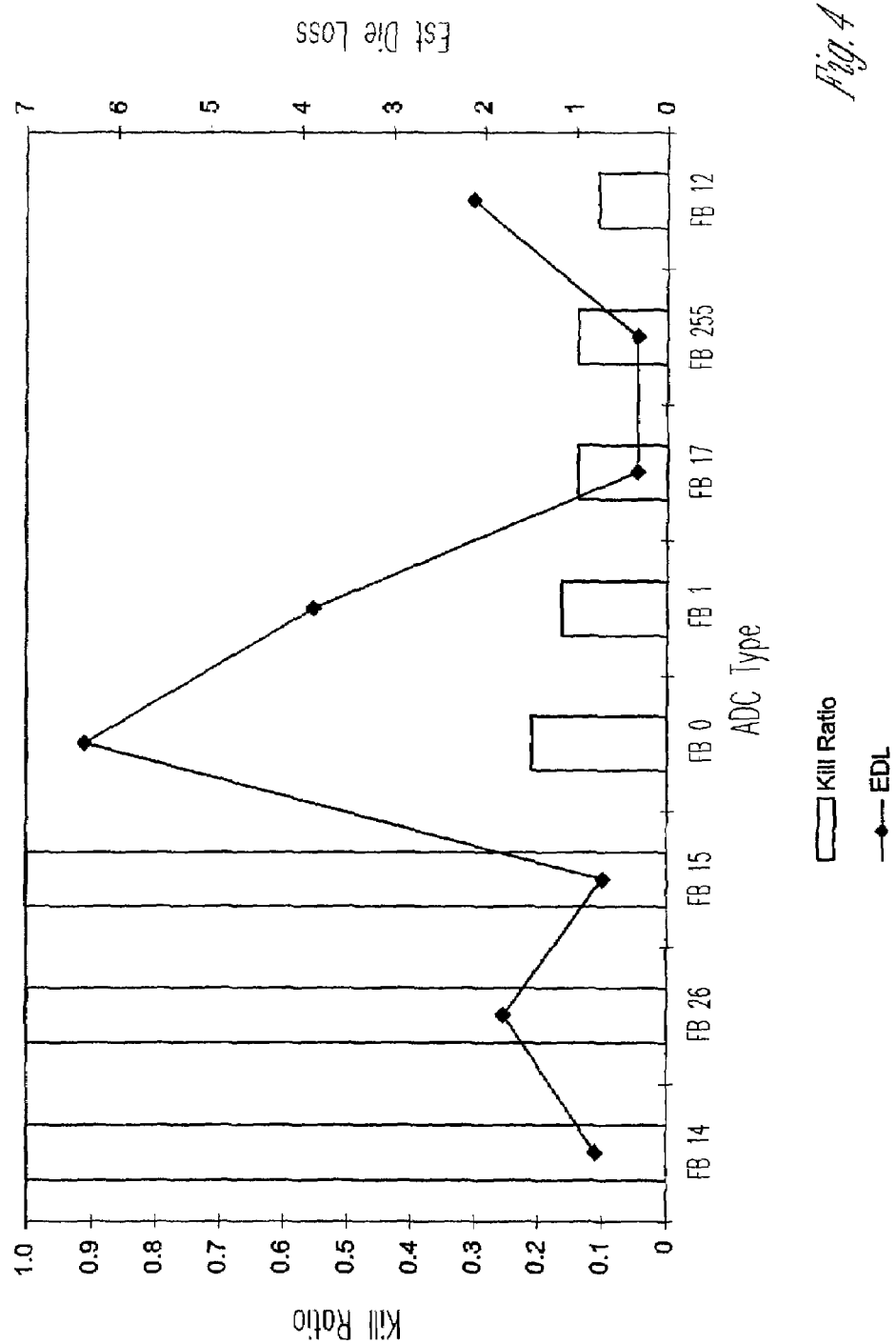
FIG. 4 is a graph illustrating an example of kill ratios generated using off-line historical data.

The predicted yield is 3.1, i.e., the sum of the individual probabilities of yield for dice #1-6 as computed above. So the EDL for the defect type FB1 is 3.1−2.7=0.4. FIG. 4 is a graph presenting the kill ratios and EDLs for a plurality of defect types resulting from using the Excel Solver function.

In-Line Die Loss Prediction

The kill ratios generated off-line are then used with in-line defect data to provide yield predictions using Equations (2) or (3). That is, kill ratios computed using historical data are used to get real time predictions. The user needs to supply kill ratio values for the defect attribute used and an estimate for the yield of baseline dice. The yield of baseline dice is a constant that is set at the user's discretion.

Table 5 presents an example of historical defect data from a previous wafer inspection used for in-line EDL prediction of a wafer of the same type. The defect data indicate that 129 defects are of the "unknown" type (type 0) for which a kill ratio $\lambda_u$ is to be determined based on the available data. In one embodiment, to determine the kill ratio $\lambda_u$, the known kill ratios of the classified defects are dynamically weighed by the proportion of that type occurring on the wafer. For the example of Table 5, the kill ratio $\lambda_u$ is 0.06667×1+0.8×0.1079+0.0333×0.1642+0.06667×0.1393+0.01667×1+0.01667×1=0.20108.

TABLE 5

An example of historical defect data from a previous wafer inspection.

| Defect Type | Number of Defects | Number of Sample | Proportion of Sample | Model Kill Ratio |
|---|---|---|---|---|
| 14 | 4 | 4/60 | 0.06667 | 1 |
| 12 | 48 | 48/60 | 0.8 | 0.1079 |
| 1 | 2 | 2/60 | 0.0333 | 0.1642 |
| 255 | 4 | 4/60 | 0.06667 | 0.1393 |
| 26 | 1 | 1/60 | 0.01667 | 1 |
| 15 | 1 | 1/60 | 0.01667 | 1 |
| 0 | 129 | | | |

The following computations show how to compute the predicted yield for each die (excluding the yield of baseline dice):

$\eta_{Yield}=(1-0.10793)^1=0.89207$ Die #1

$\eta_{Yield}=(1-0.1393)^1\cdot(1-1)^1\cdot(1-0.1642)^1=0$ Die #2

$\eta_{Yield}=(1-0.10793)^2=0.79579$ Die #3

$\eta_{Yield}=(1-0.10793)^4\cdot(1-0.1393)^1\cdot(1-0.20108)^{30}=0.00065$ Die #4

$\eta_{Yield}=(1-0.10793)^1=0.89207$ Die #5

$\eta_{Yield}=(1-0.10793)^1=0.89207$ Die #6

Table 6 presents the EDL predicted for these six dice using the defect data of Table 5 and in-line defect data for the six dice. Assuming a yield of baseline dice of 0.77, and using Equation (2), the EDL is:

$EDL=0.77(6-(0.89207+0+0.79579+0.00065+0.89207+0.89207))=1.9461$

TABLE 6

An example of data for predicting die yield for six dice.

| Die # | Probe Bin | Model kill ratio | | | | | Predicted Die Yield $\prod_i(1-\lambda_i)^{ni}$ |
|---|---|---|---|---|---|---|---|
| | | 0.10793 FB12 Defects | 0.1393 FB255 Defects | 1 FB26 Defects | 0.20108 FB0 Defects | 0.1642 FB1 Defects | |
| 1 | 8 | 1 | 0 | 0 | 0 | 0 | 0.89207 |
| 2 | I | 0 | 1 | 1 | 0 | 2 | 0 |
| 3 | * | 2 | 0 | 0 | 0 | 0 | 0.79579 |
| 4 | I | 4 | 1 | 0 | 30 | 0 | 0.00065 |
| 5 | * | 1 | 0 | 0 | 0 | 0 | 0.89207 |
| 6 | * | 1 | 0 | 0 | 0 | 0 | 0.89207 |

Table 7 illustrates an example of a model lookup table for in-line prediction of EDL attributed to all defects. The defect attribute has a value of 'none', which means that no specific defect type is specified. Only one defined kill ratio is required. No sample data (i.e., only actual data from inspection) are used to generate the kill ratio. The estimated yield of baseline dice $Y_{bl}$ has a value between 0 and 1 and is set at the user's discretion. This is no kill ratio for unknown defect type $\lambda_u$ (which is defined only if sample data are used). The kill ratio for defect type 1 $\lambda_1$ is the kill ratio per single defect for this level and device, and is computed off-line. In this example, the defect type 1 includes all defects. Table 8 illustrates an example of defect data in a defect data bin used to predict the EDL using the model lookup table of Table 7.

TABLE 7

An example of a model lookup table for "all defects" (no specific defect attribute used).

| Part | Y85B |
|---|---|
| Level | 71 ACI INSP |
| Defect Attribute | None |
| Sample Data | No |
| Yield of baseline dice, $Y_{bl}$ | 0.78 |
| Unknown Type kill ratio, $\lambda_u$ | NA |
| Type 1 kill ratio, $\lambda_1$ | 0.19857 |

TABLE 8

An example of defect data in a defect data bin.

| Die | Number of Defects |
|---|---|
| #1 | 27 |
| #2 | 3 |
| #3 | 2 |
| #4 | 1 |
| #5 | 1 |

Equation (2) is applied to compute the EDL. The predicted yield for each die is computed and summed across all six dice. Then, the number of defective dice is multiplied by the yield of baseline dice to generate a value for the number of expected yielding defective dice if there is no defect on the wafer. The difference between these two values is the EDL. That is:

$\eta_{Yield} = (0.78) \cdot (1-0.19857)^{27} = 0.00198;$     #1)

$\eta_{Yield} = (0.78) \cdot (1-0.19857)^{3} = 0.40151;$     #2)

$\eta_{Yield} = (0.78) \cdot (1-0.19857)^{2} = 0.50099;$     #3)

$\eta_{Yield} = (0.78) \cdot (1-0.19857)^{1} = 0.62512;$     #4)

$\eta_{Yield} = (0.78) \cdot (1-0.19857)^{1} = 0.062512;$     #5)

and $EDL = (0.78) \cdot (5) - (0.00198 + 0.40151 + 0.5009 + 0.62512 + 0.62512) = 1.745.$ Table 9 illustrates an example of a model lookup table for in-line prediction of EDL using defect data from a fine bin. Defects are classified by a plurality of defect types. Kill ratios are specifically generated for each defect type using off-line historical defect data for defect types selected for detection. In this example, FB0 is a bin where all non-classified defects are placed by automatic defect classification. Defect type FB0 is selected for detection, but its kill ratio is not provided in the model lookup table. Therefore, a dynamic kill ratio for defect type FB0 for each individual wafer that is inspected is computed based on the sample statistics for that wafer. Table 10 illustrates an example of the defect data in a fine bin used to predict the EDL using the model lookup table of Table 9. In this example, 10 out of 34 defects are of selected defect types. The probabilities for each selected defect type are:

$\eta(FB14) = (0/10) = 0;$ $\eta(FB12) = (6/10) = 0.6;$ $\eta(FB1) = (2/10) = 0.2;$ $\eta(FB255) = (1/10) = 0.1;$ $\eta(FB26) = (1/10) = 0.1.$ The kill ratio of defect type FB0 is an average of the known kill ratio values for all the selected defect types weighed by their frequency of occurring on the wafer. That is:

$\lambda_{FB0} = 0.0 \times 1.0 + 0.6 \times 0.1079 + 0.2 \times 1.0 + 0.1 \times 0.1393 + 0.1 \times 0.5 = 0.32867.$ Defect type FB26 is not a defect type selected for detection. That is, defects of defect type FB26 are to be detected but not identified with any defect type for which a kill ratio is specifically defined. The Unknown Type kill ratio $\lambda_u$ is used for this defect type.

TABLE 9

An example of a model lookup table for "fine bin" (a plurality of specified defect types).

| Part | Y85B |
|---|---|
| Level | 71 ACI INSP |
| Defect Attribute | Fine Bin |
| Sample Data | Yes |
| Yield of baseline dice, $Y_{bl}$ | 0.78 |
| Unknown Type kill ratio, $\lambda_u$ | 0.5 |
| Type FB14 kill ratio, $\lambda_{FB14}$ | 1.0 |
| Type FB12 ratio, $\lambda_{FB12}$ | 0.1079 |
| Type FB255 ratio, $\lambda_{FB255}$ | 0.1393 |
| Type FB1 kill ratio, $\lambda_{FB1}$ | 1.0 |

TABLE 10

An example of defect data in a fine bin.

| Die | Number of Defects | Type FB0 Defects | Type FB14 Defects | Type FB12 Defects | Type FB1 defects | Type FB255 Defects | Type FB26 Defects |
|---|---|---|---|---|---|---|---|
| #1 | 27 | 22 | 0 | 5 | 0 | 0 | 0 |
| #2 | 3 | 0 | 0 | 1 | 2 | 0 | 0 |
| #3 | 2 | 1 | 0 | 0 | 0 | 0 | 1 |
| #4 | 1 | 1 | 0 | 0 | 0 | 0 | 0 |
| #5 | 1 | 0 | 0 | 0 | 0 | 1 | 0 |

Equation (2) is applied to compute the EDL. The predicted yield for each die 5 is computed and summed across all five dice, and then the EDL is computed. That is:

$\eta_{Yield} = (0.78) \cdot (1-0.32867)^{22} \cdot (1-0.1079)^{5} = 0.00007;$     #1)

$\eta_{Yield} = (0.78) \cdot (1-0.1079)^{1} \cdot (1-1)^{2} = 0;$     #2)

$\eta_{Yield} = (0.78) \cdot (1-0.32867)^{1} \cdot (1-0.5)^{1} = 0.26182;$     #3)

$\eta_{Yield} = (0.78) \cdot (1-0.32867)^{1} = 0.52364;$     #4)

$\eta_{Yield} = (0.78) \cdot (1-0.1393)^{1} = 0.67135;$     #5)

and $EDL = (0.78) \cdot 5 - (0.00007 + 0 + 0.26182 + 0.52364 + 0.67135) = 2.443.$ Table 11 illustrates an example of a model lookup table for in-line prediction of EDL using defect data from a size bin. Defects are classified by a plurality of defect types each specified by a range of defect size. For example, a user can set up size bins to specify a number of size intervals and the size range for each interval. Table 12 illustrates an example of defect data in a size bin used to predict the EDL using the model lookup table of Table 11.

TABLE 11

An example of a model lookup table for "size bin" (a plurality of defect types each specified by a range of defect sizes).

| Part | Y85B |
|---|---|
| Level | 71 ACI INSP |
| Defect Attribute | Size Bin |
| Sample Data | No |
| Yield of baseline dice, $Y_{bl}$ | 0.78 |
| Unknown Type kill ratio, $\lambda_u$ | NA |
| Type SB1 kill ratio, $\lambda_{SB1}$ (Size 0-0.3) | 0.0405 |
| Type SB2 kill ratio, $\lambda_{SB2}$ (Size 0.3-0.8) | 0.1450 |
| Type SB3 kill ratio, $\lambda_{SB3}$ (Size 0.8-2) | 0.4519 |
| Type SB4 kill ratio, $\lambda_{SB4}$ (Size >2) | 0.2911 |

TABLE 12

An example of defect data in a size bin.

| Die | Number of Defects | Type SB1 Defects | Type SB2 Defects | Type SB3 Defects | Type SB4 Defects |
|---|---|---|---|---|---|
| #1 | 27 | 6 | 21 | 0 | 0 |
| #2 | 3 | 0 | 1 | 1 | 1 |
| #3 | 2 | 0 | 0 | 1 | 1 |
| #4 | 1 | 0 | 0 | 0 | 1 |
| #5 | 1 | 1 | 0 | 0 | 0 |

Equation (2) is applied to compute the EDL. The predicted yield for each die is computed and summed across all five dice, and then the EDL is computed. That is:

$$\eta_{Yield} = (0.78) \cdot (1-0.0405)^6 \cdot (1-0.1450)^{21} = 0.0227; \quad \#1$$

$$\eta_{Yield} = (0.78) \cdot (1-0.1450)^1 \cdot (1-0.4519)^1 \cdot (1-0.2911)^1 = 0.2591; \quad \#2$$

$$\eta_{Yield} = (0.78)(1-0.4519)^1 \cdot (1-0.2911)^1 = 0.3031; \quad \#3$$

$$\eta_{Yield} = (0.78) \cdot (1-0.2911)^1 = 0.5529; \quad \#4$$

$$\eta_{Yield} = (0.78) \cdot (1-0.0405)^1 = 0.7484; \quad \#5$$

and $$EDL = (0.78) \cdot 5 - (0.0227 + 0.2519 + 0.3031 + 0.5529 + 0.7484) = 2.021.$$

Table 13 illustrates an example of a model lookup table for in-line prediction of EDL using defect data from a class bin. Defects are classified by a plurality of defect types specified by manual classification or auto-SEM classification. The computation of the predicted yield and the EDL follows the same process as discussed above for the fine bin and the size bin.

TABLE 13

An example of a model lookup table for "class bin" (a plurality of defect types specified by manual or auto-SEM classification).

| Part | Y85B |
|---|---|
| Level | 71 ACI INSP |
| Defect Attribute | Class Bin |
| Sample Data | Yes |
| Yield of baseline dice, $Y_{bl}$ | 0.78 |
| Unknown Type kill ratio, $\lambda_u$ | 0.35 |
| Type CB1 kill ratio, $\lambda_{CB1}$ | 0.002 |
| Type CB2 kill ratio, $\lambda_{CB2}$ | 0.687 |
| Type CB3 kill ratio, $\lambda_{CB3}$ | 1.0 |

Table 13 illustrates an example of a model lookup table for in-line prediction of EDL using defect data from a rough bin. Defects are classified by a plurality of defect types specified by real-time classification. The computation of the predicted yield and the EDL follows the same process as discussed above for the fine bin and the size bin.

TABLE 14

An example of a model lookup table for "rough bin" (a plurality of defect types specified by real-time classification).

| Part | Y85B |
|---|---|
| Level | 71 ACI INSP |
| Defect Attribute | Class Bin |
| Sample Data | No |
| Yield of baseline dice, $Y_{bl}$ | 0.78 |
| Unknown Type kill ratio, $\lambda_u$ | 0.2 |
| Type RB1 kill ratio, $\lambda_{RB1}$ | 0.0 |
| Type RB2 kill ratio, $\lambda_{RB2}$ | 0.47 |

FIG. 5 is an illustration of an example of a model lookup table containing multiple combinations of parts, inspection levels, defect attributes, and kill ratios. For each part at each inspection level, the predicted yield and the EDL can be computed using method 100.

The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for in-line prediction of die loss for a semiconductor wafer including a plurality of dice during a manufacturing process, the method comprising:
   detecting defects each identified by a defect type i of a plurality of defect types on the wafer;
   producing in-line defect data including a defective die quantity m representative of a number of defective dice on the wafer and defect quantities each being a number $n_i$ of detected defects identified by the defect type i on each of the defective dice, the defective dice each being a die having at least one of the detected defects;
   receiving a plurality of kill ratios each being a kill ratio $\lambda_i$ produced for the defect type i of the plurality of defect types using off-line historical defect data resulting from inspection of previously fabricated semiconductor wafers; and
   producing an estimated die loss (EDL) for the wafer as a function of the plurality of kill ratios, an estimated yield of baseline dice $Y_{bl}$, the defective die quantity m, and the defect quantities, the baseline dice each being a die having none of the detected defects.

2. The method of claim 1, wherein producing the EDL comprises producing the EDL by using an equation:

$$EDL = (Y_{bl}) \cdot \left( m - \sum_{j=1}^{m} \prod_{i} (1-\lambda_i)^{n_i} \right).$$

3. The method of claim 1, wherein producing the EDL comprises producing the EDL after each of one or more levels of inspection before the manufacturing process is completed.

4. The method of claim 3, further comprising producing the kill ratio $\lambda_i$ for the defect type i using a historical probability of yield $\eta_{yield}$ associated with the defect type i for a die on one of the previously fabricated semiconductor wafers, the estimated yield of baseline dice $Y_{bl}$, and historical defect quantities each being a defect quantity $n_i'$ identified for the defect type i in the die on one of the previously fabricated semiconductor wafers.

5. The method of claim 4, wherein producing the kill ratio $\lambda_i$ comprises solving an equation:

$$\eta_{Yield} = (Y_{bl}') \cdot \prod_i (1 - \lambda_i)^{n_i'}.$$

6. A method for in-line prediction of die loss for a semiconductor wafer including a plurality of dice during a manufacturing process, the method comprising:
    detecting defects each identified by a defect type i of a plurality of defect types on the wafer;
    producing in-line defect data including a defective die quantity m representative of a number of defective dice on the wafer and defect quantities each being a number $n_i$ of detected defects identified by the defect type i on each of the defective dice, the defective dice each being a die having at least one of the detected defects;
    receiving a plurality of kill ratios each being a kill ratio $\lambda_i$ produced for the defect type i of the plurality of defect types using off-line historical defect data resulting from inspection of previously fabricated semiconductor wafers; and
    producing estimated probabilities of yield each being an estimated probability of yield $\eta_{yield}$ for one of the defective dice on the wafer using an estimated yield of baseline dice $Y_{bl}$, the plurality of kill ratios, and the defect quantities, the baseline dice each being a die having none of the detected defects.

7. The method of claim 6, wherein producing the estimated probabilities of yield comprises producing each of the estimated probabilities of yield for one die of the plurality of dice using an equation:

$$\eta_{Yield} = (Y_{bl}) \cdot \prod_i (1 - \lambda_i)^{n_i}.$$

8. The method of claim 6, further comprising producing an estimated die loss (EDL) for the wafer using the defective die quantity m, the estimated yield of baseline dice $Y_{bl}$, and the estimated probabilities of yield.

9. The method of claim 8, wherein producing the EDL comprises producing the EDL using an equation:

$$EDL = \left( Y_{bl} \cdot m - Y_{bl} \cdot \sum_{j=1}^{m} \eta_{Yield} \right).$$

10. The method of claim 6, wherein producing the estimated probabilities of yield comprises producing the estimated probabilities of yield after each of one or more levels of inspection before the manufacturing process is completed.

11. The method of claim 10, further comprising producing the kill ratio $\lambda_i$ for the defect type i using a historical probability of yield $\eta_{yield}$ associated with the defect type for a die on one of the previously fabricated semiconductor wafers, the estimated yield of baseline dice $Y_{bl}$, and historical defect quantities each being a defect quantity $n_i'$ identified for the defect type i in the die on one of the previously fabricated semiconductor wafers.

12. The method of claim 11, wherein producing the predetermined kill ratio $\lambda_i$ comprises solving an equation:

$$\eta_{Yield} = (Y_{bl}') \cdot \prod_i (1 - \lambda_i)^{n_i'}.$$

13. A method for in-line prediction of die loss for a semiconductor wafer including a plurality of dice during a manufacturing process, the method comprising:
    producing a plurality of kill ratios for a plurality of defect types using off-line historical defect data resulting from inspection of previously fabricated semiconductor wafers, the defect types specified for detecting defects during an in-line inspection of the semiconductor wafer, the kill ratios each produced for one defect type of the plurality of defect types and representative of a probability of a die failure due to at least one defect of the one defect type of the plurality of defect types;
    maintaining an off-line history database containing the plurality of kill ratios;
    detecting defects each identified by one defect type of the plurality of defect types on the wafer during the manufacturing process;
    producing in-line defect data associated with the detected defects; and
    producing one or more estimated probabilities of yield each for a defective die on the wafer using the plurality of kill ratios, an estimated yield of baseline dice, and the in-line defect data, the defective die being a die having at least one of the detected defects, the baseline dice each being a die having none of the detected defects.

14. The method of claim 13, further comprising producing an estimated die loss (EDL) for the wafer using the one or more estimated probabilities of yield, the estimated yield of baseline dice, and the in-line defect data.

15. The method of claim 13, wherein producing the in-line defect data comprises producing a defective die quantity representative of a number of defective dice each being a die having at least one of the detected defects and defect quantities each being a defect quantity representative of a number of detected defects identified by one defect type of the plurality of defect types on each of the defective dice.

16. The method of claim 15, further comprising defining the plurality of defect types by automatic classification.

17. The method of claim 15, further comprising defining the plurality of defect types by manual classification.

18. The method of claim 15, further comprising defining the plurality of defect types by ranges of defect size.

19. The method of claim 15, further comprising defining the plurality of defect types by automatic scanning electron microscopic classification.

20. The method of claim 15, further comprising defining the plurality of defect types by real-time classification.

* * * * *

UNITED STATES PATENT AND TRADEMARK OFFICE
CERTIFICATE OF CORRECTION

PATENT NO. : 7,485,548 B2  Page 1 of 1
APPLICATION NO. : 11/276719
DATED : February 3, 2009
INVENTOR(S) : Deshmukh et al.

It is certified that error appears in the above-identified patent and that said Letters Patent is hereby corrected as shown below:

In column 16, line 3, in Claim 11, delete "type for" and insert -- type i for --, therefor.

Signed and Sealed this

Fifth Day of May, 2009

JOHN DOLL
*Acting Director of the United States Patent and Trademark Office*